(12) United States Patent
Bae

(10) Patent No.: US 7,709,186 B2
(45) Date of Patent: May 4, 2010

(54) METHOD FOR EXPOSING PHOTORESIST FILM OF SEMICONDUCTOR DEVICE

(75) Inventor: Sang Man Bae, Chungcheongbuk-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 951 days.

(21) Appl. No.: 10/879,134

(22) Filed: Jun. 30, 2004

(65) Prior Publication Data

US 2005/0118538 A1     Jun. 2, 2005

(30) Foreign Application Priority Data

Nov. 29, 2003   (KR) ............... 10-2003-0085953

(51) Int. Cl.
    *G03F 7/20* (2006.01)
(52) U.S. Cl. .................... 430/312; 430/394
(58) Field of Classification Search ............. 430/312, 430/322, 394, 396
    See application file for complete search history.

(56) References Cited

U.S. PATENT DOCUMENTS

| 4,774,158 | A | * | 9/1988 | Vervoordeldonk et al. .... 430/30 |
| 5,308,741 | A | * | 5/1994 | Kemp ...................... 430/312 |
| 5,407,785 | A | * | 4/1995 | Leroux ..................... 430/312 |
| 2004/0025139 | A1 | * | 2/2004 | Kobayashi ................ 716/19 |

FOREIGN PATENT DOCUMENTS

KR       102000000595 A       1/2000

* cited by examiner

*Primary Examiner*—Kathleen Duda
(74) *Attorney, Agent, or Firm*—Townsend and Townsend and Crew LLP

(57) ABSTRACT

A method for exposing photoresist film of semiconductor device is disclosed. In accordance with the method, wafer is sequentially shifted the wafer by a predetermined distance so that the exposed regions before and after each shift have an overlapping region having an area larger than or equal to that of the die pattern to prevent defects on the exposure mask from being transcribed to the photoresist film.

15 Claims, 5 Drawing Sheets

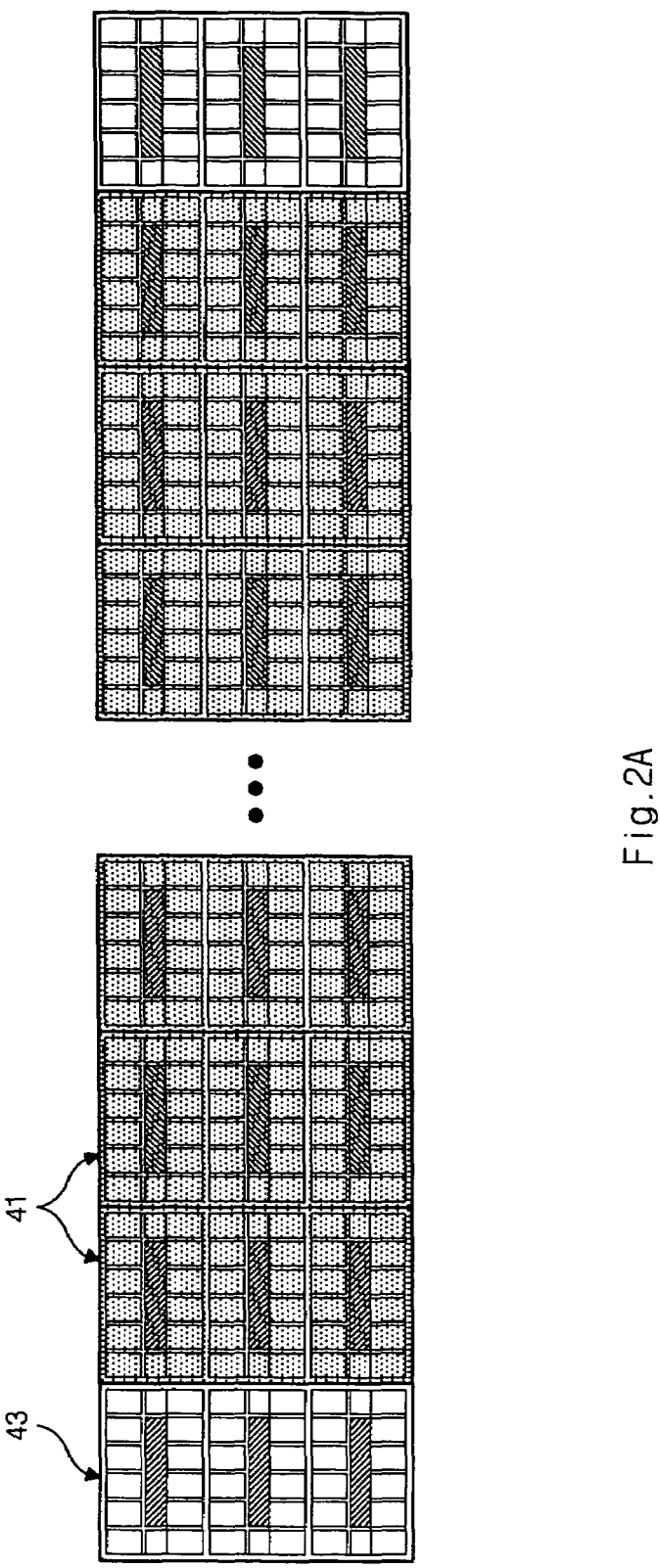

METHOD FOR EXPOSING PHOTORESIST FILM OF SEMICONDUCTOR DEVICE

BACKGROUND OF THE INVENTION

1. Field of the Invention

The present invention relates to a method for exposing photoresist film of semiconductor device, and in particular to an improved method for exposing photoresist film of semiconductor device wherein a wafer is sequentially shifted by a predetermined distance so that the exposed regions before and after each shift have an overlapping region having an area larger than or equal to that of the die pattern to prevent defects on the exposure mask from being transcribed to the photoresist film.

2. Description of the Background Art

An exposure process refers to a process for transcribing a predetermined pattern on an exposure mask to a wafer using an exposure apparatus.

Generally, a method for manufacturing an exposure mask is as follows.

A light shielding material such as chrome is deposited on a quartz substrate. Thereafter, a photoresist film reactive to electron beam is coated on the light shielding material.

Next, the photoresist film is exposed to an electron beam using an electron beam exposure apparatus including a desired pattern to be formed on a semiconductor wafer programmed therein and then developed to form a photoresist film pattern.

Thereafter, the light shielding material is etched using the photoresist film pattern as an etching mask. The photoresist film pattern is then removed to form an exposure mask including a light shielding pattern.

However, as the size of the pattern is decreased, defects are generated.

FIGS. 1a and 1b are plane views illustrating exposure mask including line patterns designed therein.

Referring to FIGS. 1a and 1b, exposure masks of FIGS. 1a and 1b comprise line type light shielding patterns 13 and 23 disposed on quartz substrates 11 and 21. Defects 15 and 25 are generated during a formation process of the light shielding patterns.

When an exposure and development process is performed using the exposure mask having defects therein, the defects are also transcribed to the semiconductor wafer.

As described above, in accordance with the conventional exposure method, defects on the exposure mask are transcribed to a thin film to be etched on the semiconductor wafer. Therefore, defective exposure mask cannot be used and must be discarded in order to prevent the defects from being transcribed to the semiconductor wafer, which lowers the productivities of exposure masks and also semiconductor devices.

SUMMARY OF THE INVENTION

Accordingly, it is an object of the present invention to provide a method for exposing photoresist film of semiconductor device wherein a wafer is sequentially shifted by a predetermined distance so that the exposed regions before and after each shift have an overlapping region having an area larger than or equal to that of the die pattern to prevent defects on the exposure mask from being transcribed to the photoresist film.

In order to achieve the above-described object of the invention, there is provided a method for exposing a photoresist film on a wafer using an exposure apparatus having a scan pitch using an exposure mask having at least one die pattern thereon, the method comprising: exposing the photoresist film by sequentially shifting the wafer by a predetermined distance in a predetermined direction, wherein exposed regions before and after each shift have an overlapping region having an area larger than or equal to that of the die pattern.

In order to achieve the above-described object of the invention, there is also provided a method for exposing a photoresist film on a wafer using a first and a second masks having least one die pattern thereon, the method comprising: exposing the photoresist film by overlapping a portion of the first mask with a portion of the second mask, wherein an area of the overlapping portion is larger than or equal to that of the die pattern.

BRIEF DESCRIPTION OF THE DRAWINGS

The present invention will become better understood with reference to the accompanying drawings, which are given only by way of illustration and thus are not limitative of the present invention, wherein:

FIGS. 2a and 2b are schematic diagrams illustrating a method for exposing a photoresist film on a die disposed on a center portion of a wafer in accordance with an embodiment of the present invention.

DETAILED DESCRIPTION OF THE PREFERRED EMBODIMENTS

A method for exposing a photoresist film in accordance with a preferred embodiment of the present invention will now be described in detail with reference to the accompanying drawings.

Figure 2B:
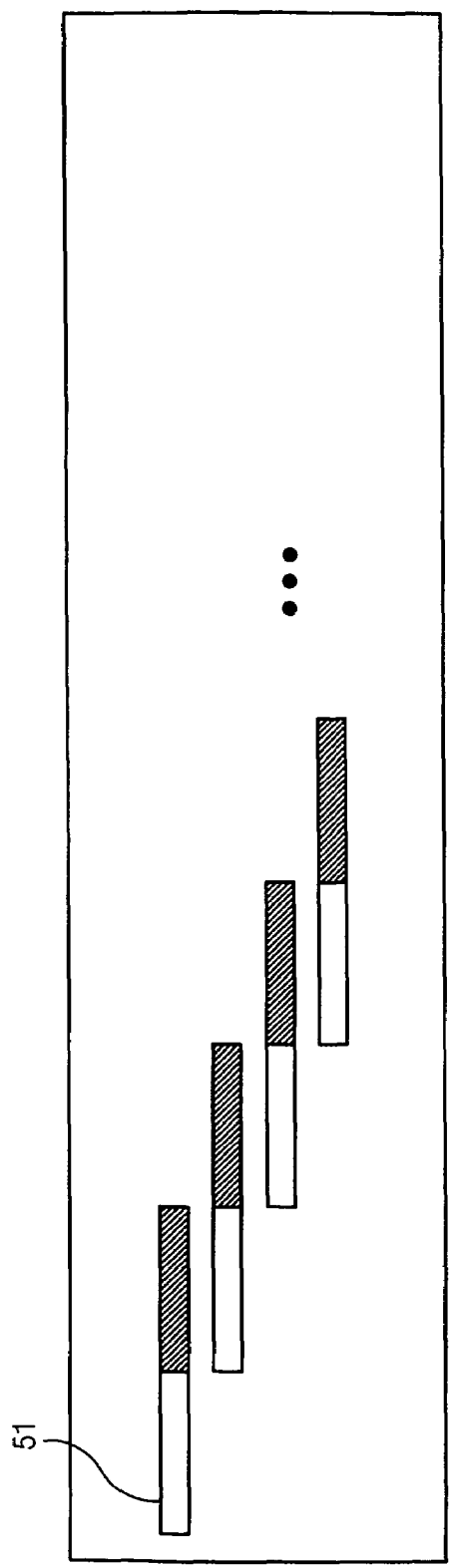

FIGS. 2a and 2b are schematic diagrams illustrating a method for exposing a photoresist film on a die disposed on a center portion of a wafer in accordance with an embodiment of the present invention.

The method of the present invention is carried out using an exposure apparatus having a scan pitch. Exposure mask used in the exposure process includes at least one die pattern thereon. The exposure mask is loaded in the exposure apparatus and a light or an electron beam is radiated on a photoresist film formed on a wafer. The wafer is then shifted by a predetermined distance in a predetermined direction, for example in x-axis or y-axis direction. The photoresist film is exposed again to a light or an electron beam, preferably having substantially the same exposure energy. The predetermined distance by which the wafer is shifted is such that the exposed regions before and after each shift have an overlapping region having an area larger than or equal to that of the die pattern. These processes are repeated until entire wafer is processed.

Referring to FIG. 2a, a die 43 on the edge of the wafer is exposed only once and the dies 41 in the center portion of the wafer are exposed at least twice when the wafer is exposed in accordance with the method.

As shown in FIG. 2b, when the exposure mask includes, for example, two die patterns, the predetermined distance is substantially the same as a width of single die pattern. That is, the wafer is sequentially shifted by a width of the die pattern for each shot until the last die on the wafer is exposed. This principal can be expanded in case of n die patterns. When the exposure mask includes n by m die patterns (n: even number, m: natural number), the wafer is shifted by a distance corresponding to widths of n/2 die patterns in the predetermined direction.

The predetermined distance may also be, for example, substantially the same as one half of the scan pitch of the exposure apparatus. That is, if the exposure apparatus can expose two dies in a single shot, the wafer is sequentially shifted by a width of one die for each shot.

Although not shown, a method in accordance with another embodiment of the present invention is described below.

The method employs a first and a second masks having least one die pattern thereon to expose a photoresist film on a wafer. First, the first and the second masks are loaded in the exposure apparatus such that a portion of the first mask overlaps with a portion of the second mask. An area of the overlapping portion of the masks is larger than or equal to that of the die pattern. The photoresist film is sequentially exposed by shifting the wafer in a predetermined direction.

Figure 1A:
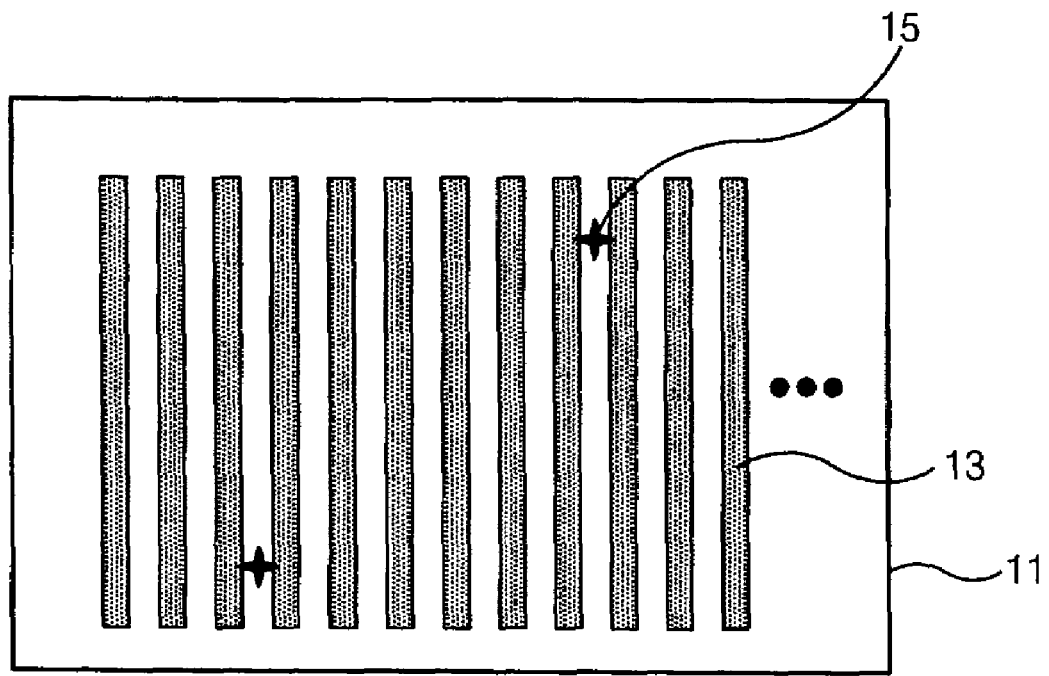
FIGS. 1a and 1b are plane views illustrating exposure mask including line patterns designed therein.
Figure 1B:
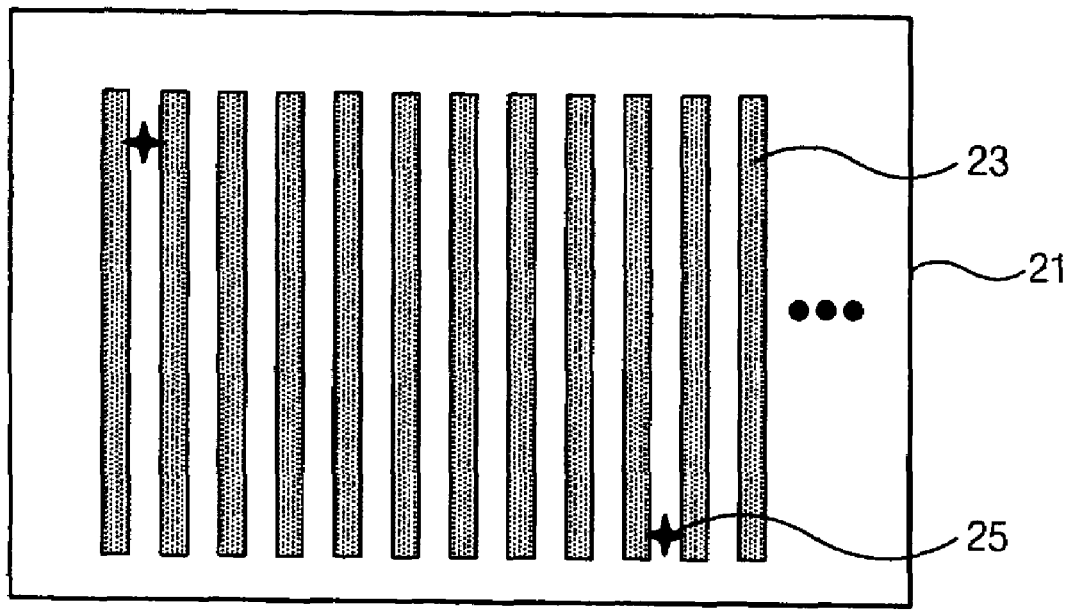
Figure 3:
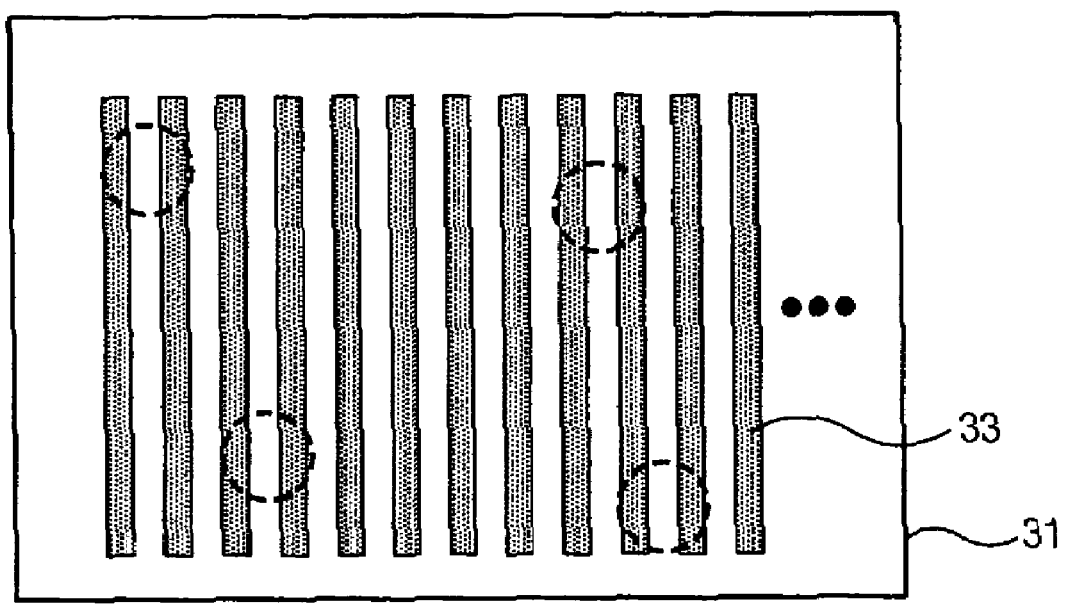
FIG. 3 is a plane view illustrating a line pattern formed using the exposure masks shown 1 FIGS. 1a and 1b in accordance with the present invention.

FIG. 3 is a plane view illustrating a line pattern formed using the exposure masks shown 1 FIGS. 1a and 1b in accordance with the present invention.

Referring to FIG. 3, a thin film to be patterned and a photoresist film are sequentially formed on a wafer 31. Thereafter, the photoresist film is exposed via the method described above and in FIGS. 2a and 2b. The photoresist film is then developed to form a photoresist film pattern 33. The defects 15 and 25 included in the exposure masks in FIGS. 1a and 1b are prevented from being transcribed to the photoresist film pattern 33 by the method of the present invention so that the photoresist film pattern 33 does not include any defects. The thin film is then etched using the photoresist film pattern 33 as an etching mask to form a thin film pattern.

As discussed earlier, in accordance with the present invention, the wafer is sequentially shifted by a predetermined distance so that the exposed regions before and after each shift have an overlapping region having an area larger than or equal to that of the die pattern. This method not only prevents defects on the exposure mask from being transcribed to the photoresist film, but also allows the use of defective exposure masks in the exposure process. As a result, the productivity of the exposure mask is improved and a photoresist film pattern and a thin film pattern without any defects can be formed.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for forming a predetermined pattern of exposed areas and unexposed areas on a photoresist film on a wafer, the method comprising:
    providing an exposure mask, the exposure mask including a first die pattern that includes a pattern of light shielding areas that prevents exposure of the predetermined pattern of unexposed areas and a second die pattern that includes the pattern of light shielding areas, wherein the pattern of light shielding areas included within the first die pattern is offset from the pattern of light shielding areas included within the second die pattern by a predetermined distance in a predetermined direction;
    exposing the photoresist film using the first die pattern;
    shifting the wafer by the predetermined distance in the predetermined direction; and
    exposing the photoresist film using the second die pattern.

2. The method according to claim 1, wherein the exposure processes after and before the shift are performed using substantially the same exposure energy.

3. The method according to claim 1, wherein the first die pattern is adjacent to the second die pattern.

4. The method according to claim 1, wherein the predetermined distance is substantially the same as one half of a scan pitch of an exposure apparatus used to expose the photoresist film.

5. The method according to claim 1, wherein the exposure mask includes n by m die patterns and the wafer is shifted by a distance corresponding to widths of n/2 die patterns in the predetermined direction where n is an even number and m is a natural number.

6. The method according to claim 1, wherein the predetermined direction is an x-axis direction or y-axis direction.

7. A method for exposing a photoresist film over a wafer by using an exposure apparatus and an exposure mask, the method comprising:
    performing a plurality of exposure processes on the photoresist film opened by the exposure mask by sequentially shifting the wafer a predetermined distance in a predetermined direction, the exposure mask including a first die pattern that includes a pattern of light shielding areas that prevents exposure of a predetermined pattern of unexposed areas and a second die pattern includes the pattern of light shielding areas that prevents exposure of the predetermined pattern of unexposed areas, wherein the pattern of light shielding areas included within the first die pattern is offset from the pattern of light shielding areas included within the second die pattern by the predetermined distance in the predetermined direction.

8. The method according to claim 7, wherein the exposure processes after and before each shift are performed using substantially the same exposure energy.

9. The method according to claim 7, wherein the predetermined distance is substantially the same as a width of the die pattern.

10. The method according to claim 7, wherein the predetermined distance is substantially the same as one half of a scan pitch included in the exposure apparatus.

11. The method according to claim 7, wherein the exposure mask includes n by m die patterns and the wafer is shifted by a distance corresponding to widths of n/2 die patterns in the predetermined direction where n is an even number and m is a natural number.

12. The method according to claim 7, wherein the predetermined direction is an x-axis direction or y-axis direction.

13. The method according to claim 7, wherein the total number of times of exposure processes is equal to the number of die patterns arranged in the predetermined direction of the exposure mask.

14. A method for exposing a photoresist film over a wafer, the method comprising:
    performing a plurality of exposure processes on the photoresist film using a combined exposure mask, wherein the combined exposure mask comprises a first mask and a second mask, wherein the first mask includes a pattern of light shielding areas that prevents exposure of a predetermined pattern of unexposed areas and the second mask includes the pattern of light shielding areas that prevents exposure of the predetermined pattern of unexposed areas, wherein the pattern of light shielding areas included within the first mask is offset from the pattern of light shielding areas included within the second mask by the predetermined distance in the predetermined direction.

15. A method according to claim 14, wherein the total number of times that the exposure processes are performed is equal to the number of die patterns arranged in the predetermined direction of each of the first and second masks.

* * * * *